United States Patent
Ross et al.

(10) Patent No.: US 11,082,038 B1
(45) Date of Patent: Aug. 3, 2021

(54) GATE DRIVER ISOLATING CIRCUIT

(71) Applicant: Allegro MicroSystems, LLC, Manchester, NH (US)

(72) Inventors: Thomas Ross, Livingston (GB); James McIntosh, Longniddry (GB); Gianluca Allegrini, Musselburgh (GB)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/017,109

(22) Filed: Sep. 10, 2020

(51) Int. Cl.
| H03K 3/00 | (2006.01) |
| H03K 17/687 | (2006.01) |
| H03K 19/0175 | (2006.01) |
| H03K 19/0185 | (2006.01) |
| H02M 1/08 | (2006.01) |
| H03K 17/06 | (2006.01) |

(52) U.S. Cl.
CPC ......... *H03K 17/063* (2013.01); *H03K 17/687* (2013.01)

(58) Field of Classification Search
None
See application file for complete search history.

(56) References Cited

U.S. PATENT DOCUMENTS

| 6,034,413 | A | 3/2000 | Hastings et al. |
| 6,256,215 | B1 | 7/2001 | Barrett et al. |
| 6,559,689 | B1 | 5/2003 | Clark |
| 6,781,423 | B1 | 8/2004 | Knoedgen |
| 7,649,325 | B2 | 1/2010 | McIntosh et al. |
| 7,688,049 | B2 * | 3/2010 | Iwabuchi ............ H03K 17/063 323/271 |
| 7,719,325 | B1 * | 5/2010 | Wang ................... H03K 17/162 327/112 |
| 7,741,901 | B2 * | 6/2010 | Lu ...................... H03K 17/6871 327/589 |
| 7,889,002 | B2 | 2/2011 | Berkhout |
| 8,461,881 | B2 * | 6/2013 | Park .................... H03K 17/795 327/108 |
| 8,564,363 | B1 * | 10/2013 | Wang .................. H03K 5/1252 327/552 |
| 8,692,587 | B1 * | 4/2014 | Dijk ................... H03K 17/0812 327/108 |
| 8,791,723 | B2 | 7/2014 | Mallikarjunaswamy |
| 9,214,884 | B2 | 12/2015 | Sonoda et al. |
| 9,294,084 | B1 | 3/2016 | McIntosh et al. |
| 9,571,093 | B2 * | 2/2017 | Kinzer ........... H03K 19/017509 |
| 9,859,883 | B2 * | 1/2018 | Huang ................ H03K 17/162 |

(Continued)

OTHER PUBLICATIONS

U.S. Appl. No. 16/819,765, filed Mar. 16, 2020, Lu.
(Continued)

*Primary Examiner* — Kenneth B Wells
(74) *Attorney, Agent, or Firm* — Daly, Crowley, Mofford & Durkee, LLP

(57) ABSTRACT

In one aspect, a circuit includes a gate driver having a first input connected to a first node and a second input connected to a second node; an epi diode connected to the first node; a switch connected to the first node; a capacitor having a top plate connected to the switch and a bottom plate connected to the second node; and a first clamp connected the first node and to the second node. The switch being open isolates the first node from negative transient effects from the top plate of the capacitor.

23 Claims, 2 Drawing Sheets

(56) References Cited

U.S. PATENT DOCUMENTS

| | | | |
|---|---|---|---|
| 9,935,452 B2 | 4/2018 | Looby et al. | |
| 9,960,764 B2 * | 5/2018 | Kinzer | H02M 1/08 |
| 10,084,407 B2 | 9/2018 | Looby et al. | |
| 10,096,705 B2 | 10/2018 | Nielsen et al. | |
| 10,122,274 B2 * | 11/2018 | Marini | H01L 29/7783 |
| 10,277,224 B2 | 4/2019 | Chan | |
| 10,666,147 B1 * | 5/2020 | Ribarich | H02M 1/0061 |
| 10,862,472 B1 * | 12/2020 | Zannoth | H02M 7/5387 |
| 2019/0305547 A1 | 10/2019 | Tran | |

OTHER PUBLICATIONS

U.S. Appl. No. 16/930,592, filed Jul. 16, 2020, Haselhuhn, Jr. et al.
U.S. Appl. No. 16/935,656, filed Jul. 22, 2020, Metivier et al.
U.S. Appl. No. 17/112,172, filed Dec. 4, 2020, Ross et al.
Notice of Allowance and Issue fee due dated Jun. 4, 2021, U.S. Appl. No. 17/112,172, 13 pages.

* cited by examiner

GATE DRIVER ISOLATING CIRCUIT

BACKGROUND

Typically, a gate driver receives a low power input and produces a high-current output. Sometimes a gate driver is fabricated in an integrated circuit (IC) and formed in an n-type epitaxial structure of an integrated circuit (IC) that is on top of a p-type substrate. The interface between the n-type epitaxial structure and the p-type substrate forms a diode (p-n junction). Typically, this diode is not active; however, if the diode turns on, unwanted current becomes available that may destroy the gate driver and the IC.

SUMMARY

In one aspect, a circuit includes a gate driver having a first input connected to a first node and a second input connected to a second node; an epi diode connected to the first node; a switch connected to the first node; a capacitor having a top plate connected to the switch and a bottom plate connected to the second node; and a first clamp connected the first node and to the second node. The switch being open isolates the first node from negative transient effects from the top plate of the capacitor.

In another aspect, an integrated circuit (IC) includes a gate driver having a first input connected to a first node and a second input connected to a second node and an epi diode connected to the first node. The gate driver is fabricated in an n-type epitaxial layer and the epi diode includes the n-type epitaxial layer and a p-type substrate. The IC also includes a first clamp connected to the first node and to the second node and a switch connected to the first node, wherein the switch comprises a transistor and a second clamp. The IC is configured to be connected to a capacitor that has a top plate connected to the switch and a bottom plate connected to the second node. The switch is open in response to negative voltages on the second node and thereby isolates the first node from the negative voltages that result at the top plate of the capacitor. With the open circuit, the epi diode is off in response to a magnitude of negative voltages on the second node not exceeding either (1) a sum of a breakdown voltage of the first clamp and a turn-on voltage of the epi diode, or (2) a sum of a breakdown voltage of the second clamp, the turn-on voltage of the epi diode and a boot voltage of the capacitor.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to enable isolation of a gate driver. As further described herein, a switch is provided to isolate a gate driver from the effects of negative transients (voltages) that may be caused, for example, by an inductive load. In particular, the negative transients may cause the activation of an epi diode that may destroy the gate driver.

Figure 1:
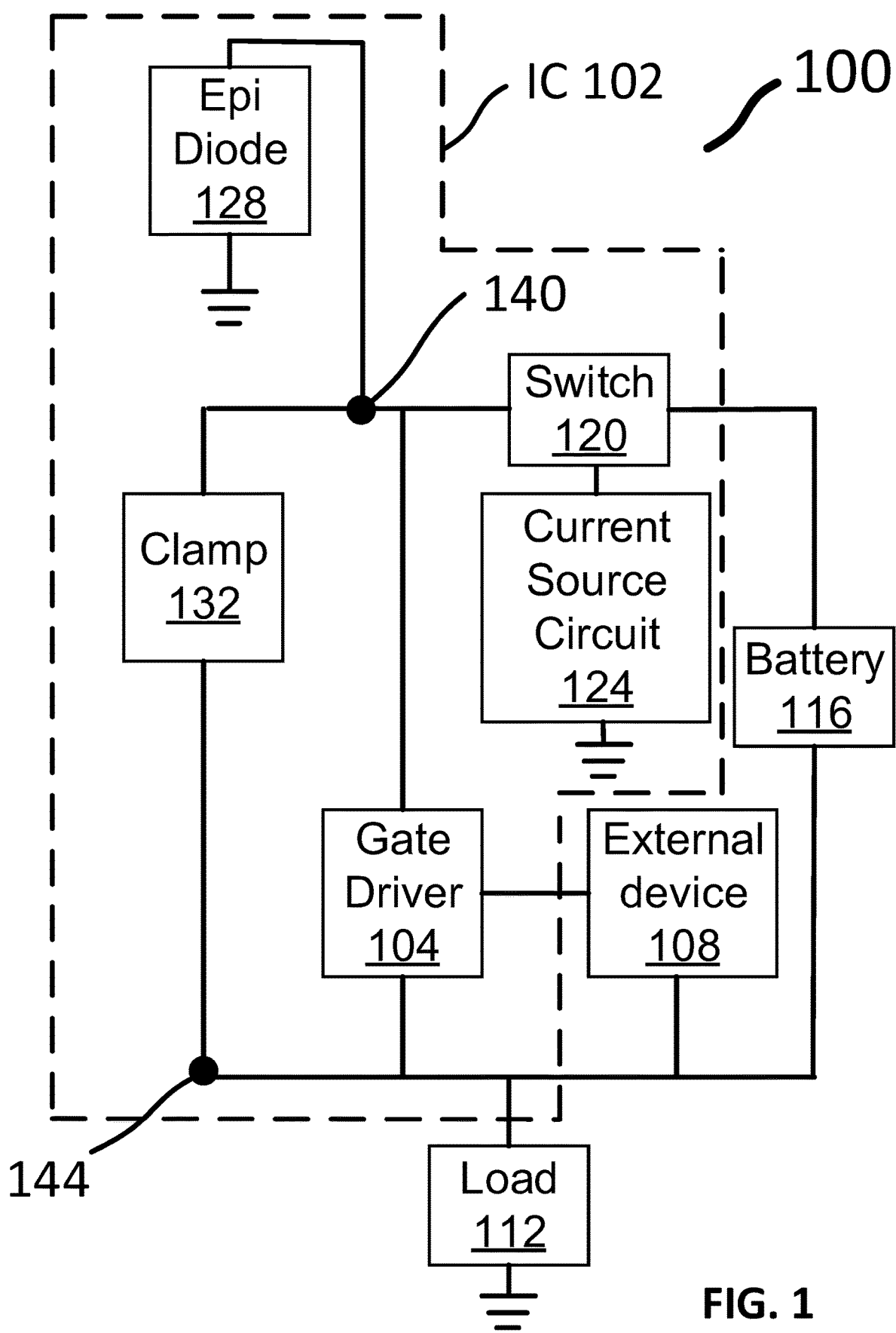
FIG. 1 is a block diagram of an example of a gate driver isolating circuit.

Referring to FIG. 1, an example of a gate driver isolating circuit is a gate driver isolating circuit 100. The circuit 100 includes an integrated circuit (IC) 102 connected to an external device 108, a load 112 and a battery 116.

The IC 102 includes a gate driver 104. The gate driver 104 has a first input connected to a first node 140 and a second node connected to a second node 144. The gate driver 104 has an output connected to the external device 108. A voltage VDP is the voltage at the first node 140 and a voltage node VDM is the voltage at the second node 144. In one example, the gate driver 104 is fabricated in an n-epitaxial tub (not shown) of the IC 102.

The IC 102 also includes a switch 120 connected to the first node 140; a clamp 132 having a cathode connected to the first node 140 and an anode connected to the second node 144; and a current source circuit 124 connected to ground and to the switch 120 to power the switch 120. The battery 116 is connected to the switch 120 and to the second node 144.

The IC 102 further includes an epi diode 128, which has a cathode connected to the first node and an anode connected to ground. The epi diode 128 is formed during the manufacturing of the IC 102. For example, the epi diode 128 includes the n-type epitaxial tub and a p-type substrate (not shown) of the IC 102.

The external device 108 is connected to the second node 144. In one example, the external device 108 may be a transistor. In one particular example, the external device 108 may be an insulated-gate bipolar transistor (IGBT) or a metal oxide semiconductor field effect transistor (MOSFET).

The load 112 is connected to the second node 144 and to ground. In one example, the load 112 may be a coil. In one particular example, the load 112 may be a motor coil. In a further example, the load 112 may be another power transistor, which would then form a half-bridge configuration.

The gate driver 104 requires a non-zero voltage (|VDP−VDM|>0) to function, and this voltage is typically stored at the battery 116, which floats relative to the voltage VDM. The voltage VDM can have extreme negative transients depending on the load 112. This can have disastrous effects for the gate driver 104, because the voltage VDP at the first node 140 will also go negative by the same negative transients.

In one example, the gate driver 104 is a floating gate driver that has isolated components that can survive the negative transients on the second node 144 which brings down the voltage on the first node 140. In particular, these gate drive components are located between the first and second nodes 140, 144 so that the gate drive components between these two nodes 140, 144 are isolated from the p-type substrate by being in the n-type epitaxial tub, which is connected to the first node 140.

Problems arise when the negative transients start to bring the voltage VDP below ground. Since the gate driver 104 is fabricated in an n-epitaxial tub, which is only a diode voltage away from the p-substrate, if the voltage VDP goes negative (e.g., by more or less than 1 Volt), then the epi diode 128 turns on. However, the gate driver 104 will only survive negative transients up to a certain point, but beyond that point, substrate injection can interfere with the rest of the IC 102 and increased energy levels can be enough to destroy the IC 102. In order to protect the gate driver 104 from these negative transients, the switch 120 is placed in series between the epi diode 128 and the battery 116 to isolate the first node 140 and the gate driver 104 from the battery 116 to inhibit the epi diode 128 from turning on.

Figure 2:
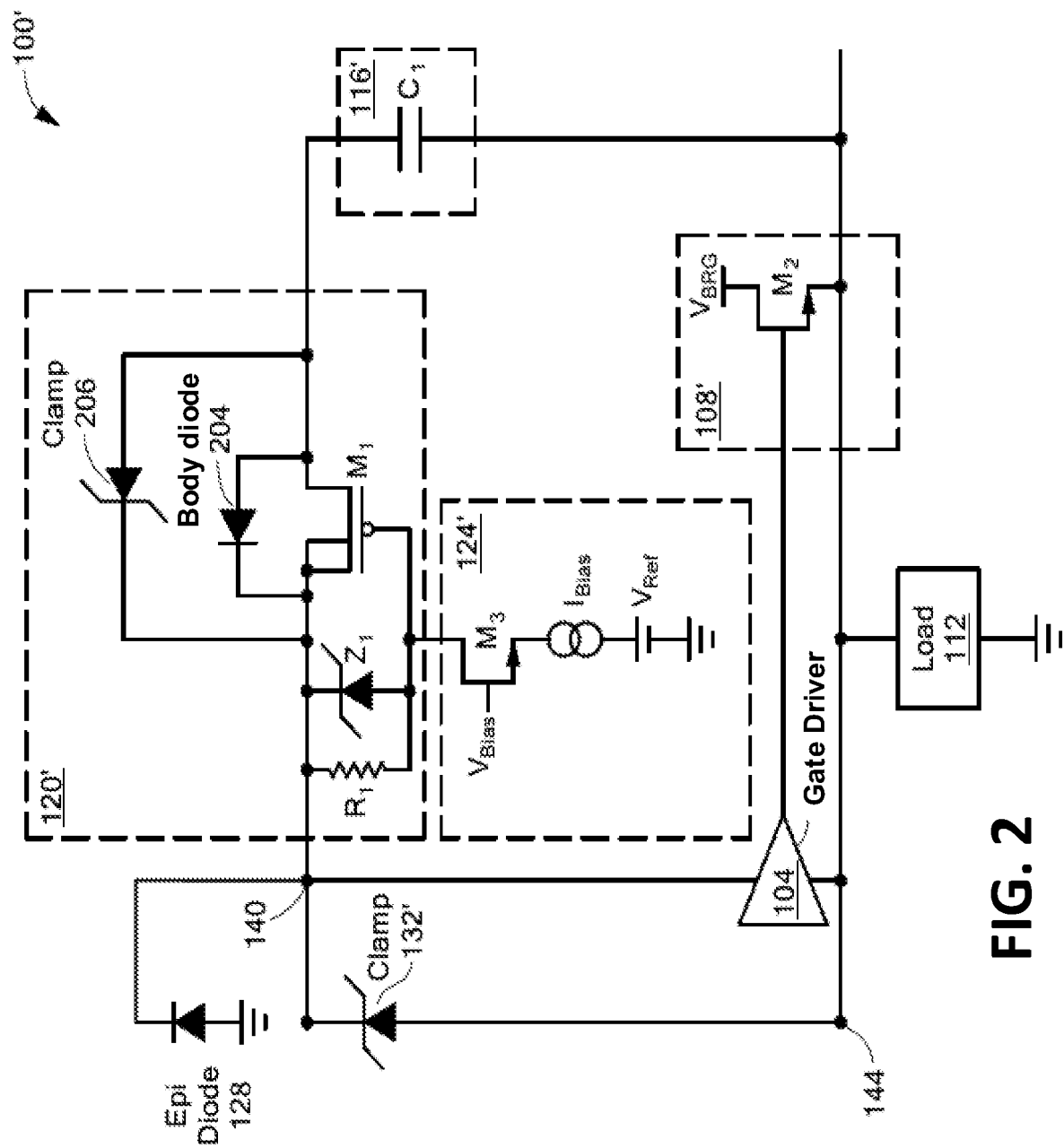
FIG. 2 is a circuit diagram of an example of the gate driver isolating circuit of FIG. 1.

Referring to FIG. 2, an example of the circuit 100 (FIG. 1) is a circuit 100'. An example of the battery 116 (FIG. 1) is a capacitor 116' or $C_1$. The capacitor $C_1$ is sometimes called a bootstrap capacitor.

An example of the external device 108 (FIG. 1) is an external device 108' or a transistor $M_2$. In one example, the transistor $M_2$ is an n-channel metal-oxide-semiconductor field-effect transistor (NMOS). A gate of the transistor $M_2$ is connected to the output of the gate driver 104. A drain of the transistor $M_2$ is connected to a voltage, $V_{BRG}$. A source of the transistor $M_2$ is connected to the second node 144.

An example of the switch 120 (FIG. 1) is a switch 120'. The switch 120' includes a transistor $M_1$. In one example, the transistor $M_1$ is a p-channel metal-oxide-semiconductor field-effect transistor (PMOS). A source of the transistor $M_1$ is connected to the first node 140 and a drain of the transistor $M_1$ is connected to the top plate of the capacitor 116'. The transistor $M_1$ includes a body diode 204 connecting the source and the drain of the $M_1$ transistor.

The switch 120' also includes a clamp 206, which is electrically parallel to the body diode 204. An anode of the clamp 206 is connected to the drain of the $M_1$ transistor and a cathode of the clamp 206 is connected to the source of the $M_1$ transistor. In one example, the clamp 206 is a Zener-activated clamp.

The switch 120' further includes a resistor $R_1$ and a Zener diode $Z_1$. The resistor R1 is connected to the gate of the transistor $M_1$ and to the source of the transistor $M_1$. An anode of the Zener diode $Z_1$ is connected to the gate of the transistor $M_1$ and a cathode of the Zener diode $Z_1$ is connected to the source of the transistor $M_1$. For example, current in the Zener diode $Z_1$ may develop a voltage across the transistor $M_1$, which turns on the transistor $M_1$. In one example, the Zener diode $Z_1$ may also be a couple diode-connected MOSFETs or any circuit device that develops a voltage across the gate-source of the transistor M1.

In one example, the switch 120' may be a low-voltage device which saves area when fabricated on the IC 102. In another example, the switch 120' may be a higher-voltage switch, which enhances immunity to negative transients.

An example of the current source circuit 124 (FIG. 1) is a current source circuit 124'. The current source circuit 124' includes a transistor $M_3$, a current source $I_{Bias}$ and a voltage source $V_{ref}$. The current source $I_{Bias}$ is connected to a reference voltage source $V_{Ref}$ which is connected to ground.

In one example, the transistor $M_3$ is an n-channel metal-oxide-semiconductor field-effect transistor (NMOS). A source of the transistor $M_3$ is connected to the current source $I_{Bims}$. A drain of the transistor $M_3$ is connected to the gate of the transistor $M_1$ and to the resistor $R_1$ and the Zener diode $Z_1$. A gate of the transistor $M_3$ is connected to a voltage source $V_{Bias}$.

An example of the clamp 132 (FIG. 1) is a clamp 132'. The clamp 132' has a cathode connected to the first node 140 and an anode connected to the second node 144. In one example, the clamp 132' is a Zener-activated clamp.

In this circuit 100', the transistor $M_1$ is in series with the first node 140 and the top plate of $C_1$. The top plate of $C_1$ does not have a direct connection to the epi diode 128 and is therefore isolated from the epi diode 128 at the node 140 and isolated from the p-substrate (not shown).

For negative transient events on the second node 144, the top plate of the capacitor $C_1$ follows and at a certain point, the transistor $M_1$ will turn into a diode (i.e., the transistor $M_1$ turns off) and will not allow the voltage at the first node 140 to be dragged down with the top plate of the capacitor $C_1$. The gate driver 104 becomes isolated and the epi diode 128 will not turn on.

The current source, $I_{BIAS}$, places a Zener voltage (Z1) across the source-gate terminals of the transistor $M_1$ and turns the transistor $M_1$ on. The transistor $M_1$ is kept on as long as it has enough source-gate voltage. The switch 120' is open in response to the voltage VDP at the first node 140 being less than a threshold voltage $V_t$ of the switch 120' if these components are ground referenced and the voltage $V_{Ref}$ is equal to ground. Otherwise, as the voltage $V_{Ref}$ increases, then the turn-off voltage increases roughly with the value of the voltage $V_{Ref}$. Thus, if the voltage at the top plate of the capacitor $C_1$ goes below the sum of the threshold voltage $V_t$ and the voltage $V_{REF}$, then the transistor $M_1$ turns off.

In one example, the switch 120' is open in response to the voltage VDP at the first node 140 having a voltage which is a voltage difference between a voltage of the source of the transistor $M_1$ and a voltage of the gate of the transistor $M_1$ being less than the threshold voltage. In one particular example, the gate of the transistor $M_1$ cannot go lower than zero volts.

The resistor $R_1$ is a passive hold-off protection device. In one example, keeping the transistor $M_1$ on is beneficial as there is typically on an-chip regulator (not shown) that charges the top plate of the capacitor $C_1$ up relative to ground when the voltage VDM is held low.

When the transistor $M_2$ turns on, the voltage VDM at the second node 144 lifts to voltage $V_{BRG}$. If, for example, 10V was across the capacitor $C_1$, then the top plate of the capacitor $C_1$ lifts to $V_{BRG}+10V$. The voltage VDP at the first node 140 connects to the top plate of C1 through the low-impedance transistor $M_1$ such that the capacitor $C_1$ supplies the gate driver 104.

The switch 120' provides a number of benefits. In one example, as long as the epi diode 128 does not turn on, the capacitor $C_1$ is protected from being overcharged. An over-charged capacitor $C_1$ can damage the gate of the transistor $M_2$ and destroy the transistor $M_2$.

In another example, if the switch 120' were replaced with a replacement diode instead that has an anode connected to top plate of $C_1$ and a cathode connected to the first node 140, then the voltage VDP at the first node 140 would lift with the capacitor $C_1$, but through the replacement diode, so there would be an excess power consumption.

Furthermore, this replacement diode would have to be a high-voltage diode, which typically has approximately 10% or more leakage to the substrate. However, there is reduced leakage to the substrate using the switch 120'.

Also, for low-going voltage edges on the first node 140 (that are not necessarily negative), the gate driver 104 would be pulled low, but through the clamp 132'. Every time this happens, the gate driver 104 is overstressed and consumes extra power. However, the solution of using the switch 120' instead of the replacement diode will remove these issues, because this solution now has a switch from the first node 140 to the top plate of the capacitor $C_1$, so that the gate driver 104 looks like a normal bootstrap-capacitor driven gate driver.

Thus, with the switch 120', when the voltage VDM goes below ground for specific load conditions (for example in a high-current integrated starter-generator system where there are very high currents), the voltage VDP follows the top plate of the capacitor $C_1$ but only down to a limit. When the top plate of the capacitor $C_1$ starts to approach ground, the transistor $M_1$ turns off because the PMOS does not have enough source-gate voltage to remain on.

The transistor $M_1$ is connected such that its body diode 204 isolates negative voltages on the top plate of the capacitor $C_1$ from the first node 140. The epi diode 128 will not go negative and will not inject to substrate. In a typical system without the addition of the switch 120', this will happen, and the epi diode 128 will only dissipate so much energy (related to the size of the tub) before device destruction occurs.

The voltage at which the transistor $M_1$ turns into a diode can be tuned depending on the value of the reference voltage $V_{Ref}$. The higher the reference voltage $V_{Ref}$ is, the higher the voltage at which the transistor $M_1$ turns into a diode.

Clamp 132' limits the voltage across the gate driver 104 and clamp 206 protects the transistor $M_1$ by protecting the drain-source voltage of the $M_1$ transistor. The Zener diode Z1 protects the gate-source of the M1 transistor as well as acting as a turn-on clamp for the M1 transistor. The epi diode 128 may turn on if the magnitude of the negative voltage on the second node 144 exceeds the lesser of (1) a sum of a breakdown voltage of the clamp 132' and a turn-on voltage of the epi diode 128 or (2) a sum of a breakdown voltage of the second clamp 206, the turn-on voltage of the epi diode 128 and a boot voltage of the capacitor $C_1$.

For example, if clamp 132' has a breakdown voltage of 20V and the epi diode 128 has a turn-on voltage of 1V, then the voltage VDM at the second node 144 can go 20V below ground before the voltage VDP at the first node 140 starts to go negative. At 21V below ground, the epi diode 128 turns on.

Depending on the boot voltage of the capacitor $C_1$ (which will normally be charged up), the breakdown voltage of the second clamp 206 provides extra headroom compared to a conventional system before the voltage VDP at the first node 140 starts to go negative.

For example, if a boot voltage of the capacitor $C_1$ is 12V, the breakdown voltage of the second clamp 206 is 6V and the turn-on voltage of the epi diode 128 is 1V, then a sum of a breakdown voltage of the second clamp 206, the turn-on voltage of the epi diode 128 and a boot voltage of the capacitor $C_1$ is 19V. Thus, 18V is how far below ground the voltage VDM at the second node 144 can go prior to the voltage VDP at the first node 140 going negative and at 19V below ground, the epi diode 128 turns on. This is a significant improvement over conventional systems where, in this example, the epi diode 128 would otherwise start injecting at 13V (sum of the turn on voltage of the epi diode 128 and the boot voltage of the capacitor $C_1$) below ground.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A circuit comprising:
   a gate driver having a first input connected to a first node and a second input connected to a second node;
   an epi diode connected to the first node;
   a switch connected to the first node;
   a capacitor having a top plate connected to the switch and a bottom plate connected to the second node; and
   a first clamp connected to the first node and to the second node,
   wherein the switch being open isolates the first node from negative transient effects from the top plate of the capacitor.

2. The circuit of claim 1, wherein the switch comprises a second clamp connected to the first node and to the top plate of the capacitor.

3. The circuit of claim 2, wherein, with the switch being open, the epi diode is off in response to a magnitude of negative voltages on the second node not exceeding either (1) a sum of a breakdown voltage of the first clamp and a turn-on voltage of the epi diode, or (2) a sum of a breakdown voltage of the second clamp, the turn-on voltage of the epi diode and a boot voltage of the capacitor.

4. The circuit of claim 1, wherein the switch is a transistor.

5. The circuit of claim 4, wherein the transistor is a p-channel metal-oxide-semiconductor field-effect transistor (PMOS).

6. The circuit of claim 5, wherein the switch further comprises a Zener diode having an anode connected to a gate of the transistor and a cathode connected to the first node.

7. The circuit of claim 5, wherein the switch further comprises a resistor having one end connected to the gate of the transistor and the other end connected to the first node.

8. The circuit of claim 4, wherein a gate of the transistor is connected to a current source circuit,
   wherein a source of the transistor is connected to the first node, and
   wherein a drain of the transistor is connected to the top plate of the capacitor.

9. The circuit of claim 8, wherein the transistor is a first transistor,
   wherein the current source circuit further comprises a current source, a reference voltage source, and a second transistor,
   wherein a drain of the second transistor is connected to the gate of the first transistor,
   wherein a source of the second transistor is connected to the current source, and
   wherein the current source is connected to the reference voltage source.

10. The circuit of claim 9, wherein the second transistor is an n-channel metal-oxide-semiconductor field-effect transistor (NMOS).

11. The circuit of claim 1, wherein the first clamp is a Zener-activated clamp.

12. The circuit of claim 1, wherein an output of the gate driver is connected to an external device.

13. The circuit of claim 12, wherein the external device is a transistor.

14. The circuit of claim 13, wherein the transistor is an n-channel metal-oxide-semiconductor field-effect transistor (NMOS),
   wherein a gate of the NMOS is connected to the output of the gate driver, and
   wherein a source of the NMOS is connected to the second node.

15. The circuit of claim 1, wherein the second node is connected to a load.

16. The circuit of claim 1, wherein the load is a coil.

17. The circuit of claim 1, wherein the gate driver is fabricated in an n-type epitaxial layer.

18. The circuit of claim 16, wherein the epi diode comprises the n-type epitaxial layer and a p-type substrate.

19. The circuit of claim 1, wherein the circuit is an integrated circuit.

20. An integrated circuit (IC) comprising:
a gate driver having a first input connected to a first node and a second input connected to a second node, wherein the gate driver is fabricated in an n-type epitaxial layer;
an epi diode connected to the first node, wherein the epi diode comprises the n-type epitaxial layer and a p-type substrate;
a first clamp connected to the first node and to the second node; and
a switch connected to the first node, wherein the switch comprises a transistor and a second clamp,
wherein the IC is configured to be connected to a capacitor having a top plate connected to the switch and a bottom plate connected to the second node,
wherein the switch is open in response to negative voltages on the second node and thereby isolates the first node from the negative voltages that result at the top plate of the capacitor,
wherein, with the switch being open, the epi diode is off in response to a magnitude of negative voltages on the second node not exceeding either (1) a sum of a breakdown voltage of the first clamp and a turn-on voltage of the epi diode, or (2) a sum of a breakdown voltage of the second clamp, the turn-on voltage of the epi diode and a boot voltage of the capacitor.

21. The IC of claim 20, wherein the transistor is a p-channel metal-oxide-semiconductor field-effect transistor (PMOS),
wherein the switch further comprises a Zener diode having an anode connected to a gate of the transistor and a cathode connected to the first node,
wherein the switch further comprises a resistor having one end connected to the gate of the transistor and the other end connected to the first node,
wherein a gate of the transistor is connected to a current source circuit,
wherein a source of the transistor is connected to the first node, and
wherein a drain of the transistor is connected to the top plate of the capacitor.

22. The IC of claim 21, wherein the transistor is a first transistor,
wherein the current source circuit further comprises a current source, a reference voltage source, and a second transistor,
wherein a drain of the second transistor is connected to the gate of the first transistor,
wherein a source of the second transistor is connected to a current source,
wherein the current source is connected to the reference voltage source, and
wherein the second transistor is an n-channel metal-oxide-semiconductor field-effect transistor (NMOS).

23. The circuit of claim 20, wherein the first and second clamps are Zener-activated clamps.

* * * * *

UNITED STATES PATENT AND TRADEMARK OFFICE
CERTIFICATE OF CORRECTION

PATENT NO. : 11,082,038 B1
APPLICATION NO. : 17/017109
DATED : August 3, 2021
INVENTOR(S) : Thomas Ross et al.

It is certified that error appears in the above-identified patent and that said Letters Patent is hereby corrected as shown below:

In the Specification

Column 1, Line 22 delete "connected the" and replace with --connected to the--.

Column 2, Lines 10-11 delete "second node connected" and replace with --second input connected--.

Column 3, Line 31 delete "R1" and replace --$R_1$--.

Column 3, Line 40 delete "M1." and replace with --$M_1$.--.

Column 3, Line 53 delete "$I_{BIMS}$." and replace with --$I_{BIAS}$.--.

Column 4, Line 6 delete "(Z1)" and replace with --($Z_1$)--.

Column 4, Line 28 delete "on an-chip" and replace with --an on-chip--.

Column 4, Line 35 delete "C1" and replace with --$C_1$--.

Column 4, Lines 44-45 delete "to top" and replace with --to the top--.

Column 5, Line 19 delete "Z1" and replace with --$Z_1$--.

Column 5, Line 19 delete "M1" and replace with --$M_1$--.

Column 5, Line 20 delete "M1" and replace with --$M_1$--.

Signed and Sealed this
Fourteenth Day of May, 2024

Katherine Kelly Vidal
*Director of the United States Patent and Trademark Office*